United States Patent
He

(10) Patent No.: US 10,629,854 B2
(45) Date of Patent: Apr. 21, 2020

(54) SUBSTRATE PRE-BAKING DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Hengzhong He, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 174 days.

(21) Appl. No.: 15/579,676

(22) PCT Filed: Oct. 27, 2017

(86) PCT No.: PCT/CN2017/107996
§ 371 (c)(1),
(2) Date: Dec. 5, 2017

(87) PCT Pub. No.: WO2019/033560
PCT Pub. Date: Feb. 21, 2019

(65) Prior Publication Data
US 2019/0058167 A1  Feb. 21, 2019

(30) Foreign Application Priority Data

Aug. 18, 2017 (CN) .......................... 2017 1 0713293

(51) Int. Cl.
H01L 51/56 (2006.01)
F27D 3/00 (2006.01)
(Continued)

(52) U.S. Cl.
CPC ............ *H01L 51/56* (2013.01); *F27D 3/0084* (2013.01); *F27D 99/0075* (2013.01);
(Continued)

(58) Field of Classification Search
CPC ...................................................... H01L 51/56
See application file for complete search history.

(56) References Cited

U.S. PATENT DOCUMENTS

2005/0198857 A1* 9/2005 Nakazawa ............ B08B 7/0071
34/391
2009/0255287 A1 10/2009 Alahyari et al.
(Continued)

FOREIGN PATENT DOCUMENTS

CN   101087547 A   12/2007
CN   101451887 A   6/2009
(Continued)

OTHER PUBLICATIONS

CN202305712—machine translation (Year: 2012).*

*Primary Examiner* — Nathaniel Herzfeld
(74) *Attorney, Agent, or Firm* — Muncy, Geissler, Olds & Lowe, PC

(57) ABSTRACT

In a substrate pre-baking device, a baking box housing includes a baking chamber in an interior space of the baking box housing, wherein an opening corresponding to a side door is arranged on a lateral side of the baking box housing. The side door is arranged at the opening of the baking box housing. A heating structure is arranged in the baking chamber. A hot air curtain device is arranged at the side door of the baking box housing. When the side door is opened, the hot air curtain device is configured to form a hot air curtain for isolating the baking chamber from outside environment at the opening of the side door.

7 Claims, 2 Drawing Sheets

(51) Int. Cl.
  *F27D 99/00* (2010.01)
  *H01L 51/00* (2006.01)
  *F27D 19/00* (2006.01)

(52) U.S. Cl.
  CPC .. *H01L 51/0029* (2013.01); *F27D 2019/0031* (2013.01); *F27D 2019/0034* (2013.01); *F27D 2019/0084* (2013.01)

(56) References Cited

U.S. PATENT DOCUMENTS

| | | | | |
|---|---|---|---|---|
| 2010/0111512 A1* | 5/2010 | Kumagai | ............. | G01J 5/60 392/416 |
| 2011/0160521 A1* | 6/2011 | Khodak | ............. | A61G 11/00 600/22 |
| 2012/0051722 A1* | 3/2012 | Humphrey | ............. | A47J 36/24 392/379 |

FOREIGN PATENT DOCUMENTS

| | | |
|---|---|---|
| CN | 202305712 U | 7/2012 |
| CN | 204963442 U | 1/2016 |
| DE | 20313944 U1 | 1/2005 |
| JP | 04270878 A * | 9/1992 |
| JP | H08-189674 A | 7/1996 |

* cited by examiner

SUBSTRATE PRE-BAKING DEVICE

BACKGROUND

Field

The present disclosure relates to a technical field of manufacturing processes of display devices, and more particularly to a substrate pre-baking device.

Background

In manufacturing processes of light emitting diode (OLED) products, many heat baking processes are required. For example, in photo-etching processes, after photoresist layers are coated on substrates, pre-baking treatments are needed before exposure of the substrates, such that solvent in the photoresist layers can be removed in heating and baking processes. Thus, sensitivity of the photoresist layers can be improved, and patterns of the photoresist layers, obtained after exposure, are better.

In the pre-baking treatments, glass substrates are arranged on a constant-temperature heating plate in a closed space for heating. When a baking box is started and operated for a preset heating time, a door of the backing box is opened and one glass substrate is taken out by a robot and another glass substrate is placed into the baking box.

When the door of the backing box is opened, environmental air can enter the baking box to cause local temperature reduction, such that the solvent in the photoresist layers is condensed on a shielding layer, thereby downgrading exposure of the OLED products due to particle generation. In addition, because the local temperature in the baking box is lower, pattern defects of the photoresist layers are caused by development procedures. In addition, when the door of the backing box is opened, leakage of the solvent in the photoresist layers causes air pollution.

SUMMARY OF DISCLOSURE

Embodiments of the present disclosure provide a substrate pre-baking device having a hot air curtain device for isolating baking chamber from outside environment to improve product yield rate of the display devices.

To solve the above-mentioned problems, the present disclosure provides following solutions.

In a substrate pre-baking device according to a first embodiment, a baking box housing includes a baking chamber in an interior space of the baking box housing, wherein an opening corresponding to a side door is arranged on a lateral side of the baking box housing. The side door is arranged at the opening of the baking box housing. A heating structure is arranged in the baking chamber. A hot air curtain device is arranged at the side door of the baking box housing. When the side door is opened, the hot air curtain device is configured to form a hot air curtain for isolating the baking chamber from outside environment at the opening of the side door.

In the substrate pre-baking device, the hot air curtain device includes a plurality of air outlets, a plurality of channels, a plurality of heating tubes, and at least one fan. The air outlets are arranged on an upper side of the opening corresponding to the side door. The channels is in communication with the air outlets. The heating tubes are arranged in the channels and connected with a controller. The at least one fan is arranged in the channels and connected with the controller.

In the substrate pre-baking device, the air outlets include a first row of exhaust outlets and a second row of exhaust outlets. The first row of exhaust outlets are arranged on a side, that is adjacent to the baking chamber, of the opening of the side door, and configured to form a first hot air curtain. The second row of exhaust outlets arranged a side, that is adjacent to the external environment, of the opening of the side door, and configured to form a second hot air curtain. The first row of exhaust outlets and the second row of exhaust outlets are arranged side by side.

In the substrate pre-baking device, wind speed of the second hot air curtain is less than wind speed of the first hot air curtain.

In the substrate pre-baking device, temperature of the second hot air curtain is less than temperature of the first hot air curtain.

In the substrate pre-baking device, temperature in the first hot air curtain and temperature in the baking chamber are kept constant.

In one embodiment, the substrate pre-baking device further includes a control device, wherein the heating structure and the hot air curtain device are connected with the control device for transmitting signals. The control device is configured to detect real-time temperature of the baking chamber. The heating structure is configured to control real-time temperature of the baking chamber and detect real-time temperature of the hot air curtain. The hot air curtain device is configured to control temperature and wind speed of the hot air curtain.

In the substrate pre-baking device, the control device includes a first temperature sensor set, a second temperature sensor set, and a controller. The first temperature sensor set is arranged in the baking chamber, and configured to detect real-time temperature of the baking chamber. The second temperature sensor set is arranged at the side door, and configured to detect the real-time temperature of the hot air curtain. The controller is connected to the first temperature sensor set and the second temperature sensor set for transmitting signals. The first temperature sensor set and the second temperature sensor set are configured to transmit the detected real-time temperature to the controller.

In the substrate pre-baking device, the control device further includes a wind speed sensor set that is connected with the controller, configured to acquire wind speed information of the hot air curtain, and transmits the wind speed information to the controller.

In one embodiment, the substrate pre-baking device further includes an angle sensor arranged on the side door and connected with the controller. The angle sensor is configured to acquire open information of the side door, and when the controller receives the open information of the side door from the angle sensor, the controller controls the hot air curtain system that starts operating.

In the present disclosure, advantages of the substrate pre-baking device are that when the door opening of the baking box housing is opened, and the air in the baking chamber of the baking housing body can be effectively prevented from flowing into outside environment or airflow in the external environment to enter the baking chamber. Thus, local temperature changes caused by airflow interaction are effectively avoided, and product yield rate is effectively improved.

BRIEF DESCRIPTION OF DRAWINGS

The following embodiments refer to the accompanying figures for exemplifying specific implementable embodiments of the present disclosure.

Figure 1:
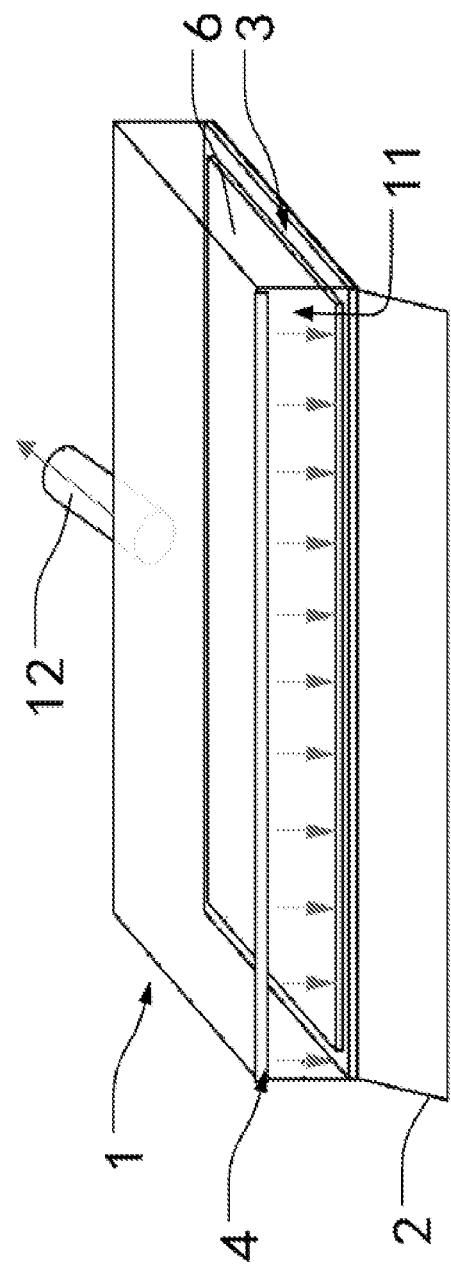
FIG. 1 is an illustrative structural diagram of a baking device that forms a hot air curtain according to one embodiment of the present disclosure.

REFERENCE NUMBERS 1 baking box housing
2 side door
3 heating structure
4 hot air curtain device
5 control device
6 substrate
11 baking chamber
12 exhaust channel
51 first temperature sensor set
52 second temperature sensor set
53 wind speed sensor set
54 angle sensor
55 controller

DETAILED DESCRIPTION OF PREFERRED EMBODIMENTS

The following embodiments refer to the accompanying figures for exemplifying specific implementable embodiments of the present disclosure. It should be noted that the exemplary described embodiments are configured to describe and understand the present disclosure, but the present disclosure is not limited thereto. Directional terms, such as an upper side, a lower side, a front side, a back side, a left side, a right side, an inner side, an outer side, and a lateral side, mentioned in the present disclosure are only for reference. Therefore, the directional terms are used for describing and understanding rather than limiting the present disclosure. In the figures, units having similar structures use the same reference numbers.

In a first embodiment, as shown in FIG. 1, a substrate pre-baking device for substrate 6 includes a baking box housing 1, a side door 2, a heating structure 3, and a hot air curtain device 4. In one embodiment of the present disclosure, the substrate pre-baking device is a simpler structure.

In one embodiment, an interior space of the baking box housing 1 defines a baking chamber 11, and an opening of the side door 2 is arranged on a lateral side of the baking box housing 1. An exhaust channel (e.g., a pipeline) 12 communicated with the baking chamber 11 is further arranged on the baking box housing 1. For example, the baking box housing 1 has a shape of a cuboid. A side plate is arranged on one side of the cuboid of the baking box housing 1 for forming a side opening.

In one embodiment, the side door 2 is arranged at the opening of the side door 2. For example, the side door 2 is a type of an opening door. In another embodiment, the side door 2 is equipped with a sliding door. A sealing state of the opening door is better. For example, the opening door is hinged in a lower side of the opening of the side door 2.

In one embodiment, the heating structure 3 is arranged in the baking chamber 11. The heating structure 3 includes a heating plate that is arranged at a bottom surface of the baking chamber 11.

In one embodiment, the hot air curtain device 4 is arranged at the side door 2 of the baking box housing 1. The hot air curtain device 4 includes air outlets, channels (e.g., a pipelines), heating tubes, and at least one fan. The air outlets are arranged on an upper side of the opening of the side door 2. The channels are communicated with the air outlets. The heating tubes are arranged in the channels and is connected with a controller. The at least one fan is arranged in the channels and is connected with the controller. When the side door 2 is opened, the hot air curtain device 4 is configured to form a hot air curtain for isolating the baking chamber 11 from outside environment at the opening of the side door 2.

In a second embodiment, differences between this embodiment and the first embodiment are that the air outlet includes a first row of exhaust outlets and a second row of exhaust outlets. The first row of exhaust outlets is arranged on a side, that is adjacent to the baking chamber 11, of the opening of the side door 2, and is configured to form a first hot air curtain. The second row of exhaust outlets is arranged a side, that is adjacent to external environment, of the opening of the side door 2, and is configured to form a second hot air curtain, wherein the first row of exhaust outlets and the second row of exhaust outlets are arranged side by side.

In one embodiment, wind speed of the second hot air curtain is less than wind speed of the first hot air curtain. For example, the first row of exhaust outlets can be provided with a first fan and a first pipeline for the first hot air curtain. The second row of exhaust outlets can be provided with a second fan and a second pipeline for the second hot air curtain. The wind speed is controlled by rotating speed of the first and second fans. In one embodiment, the first row of exhaust outlets and the first row of exhaust outlets uses a fan that corresponds to the first pipeline and the second first pipeline. The fan is connected with the first row of exhaust outlets through the first pipeline. The fan is also connected with the second row of exhaust outlets through the second pipeline. For example, openings of the first row of exhaust outlets are less than these of the second row of exhaust outlets. In one embodiment, the first hot air curtain and the second hot air curtain have a speed difference. In one embodiment, temperature of the second hot air curtain can be close to that of external environment, and is less than temperature of the first hot air curtain. Temperature of the first hot air curtain is approximately the same as temperature in the baking chamber 11. At this moment, step speed differences exist between airflow of the external environment, the second hot air curtain, and the first hot air curtain. In addition, heat exchange between the second hot air curtain and the external environment is smaller. Furthermore, heat exchange between the second hot air curtain and the first hot air curtain is also smaller. Thus, original temperature of the first hot air curtain is effectively kept, such that the temperature in the first hot air curtain and the temperature in the baking chamber 11 are kept constant.

According to the above-mentioned embodiments, heat exchange can be reduced, and a constant temperature state of the baking chamber 11 is effectively kept, such that and product yield rate of the display devices is further improved.

Figure 2:
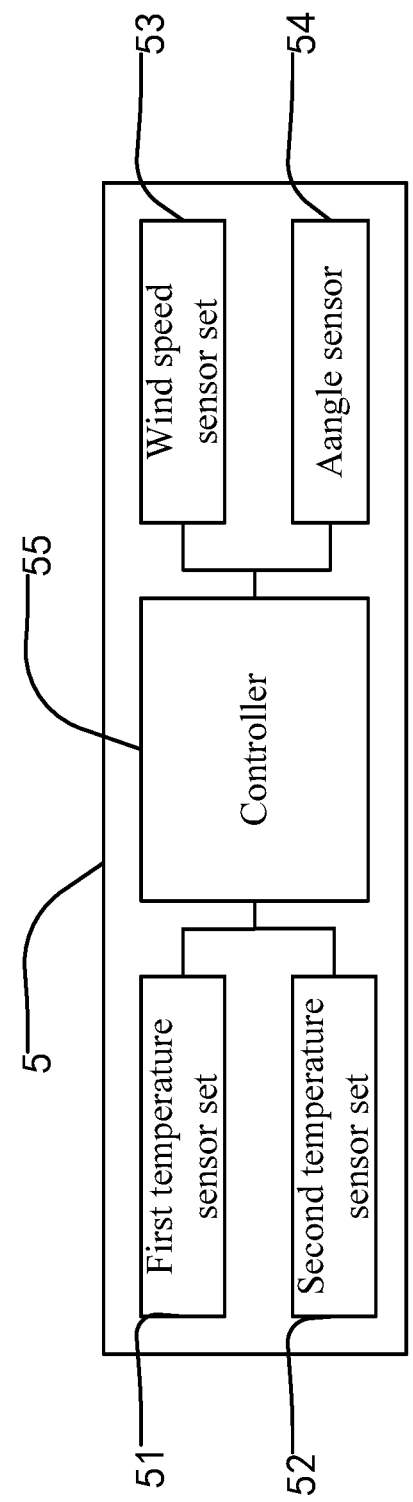
FIG. 2 is an illustrative structural diagram of a control device according to one embodiment of the present disclosure.

In a third embodiment, as shown in FIG. 2, differences between this embodiment and the first and second embodiments are that a control device 5 is arranged in the substrate pre-baking device, and is used for intelligently replacing manual control procedures. The heating structure 3, and the hot air curtain device 4 are connected with the control device 5 for transmitting signals. The control device 5 is configured to detect real-time temperature of the baking chamber 11. The heating structure 3 is configured to control real-time temperature of the baking chamber 11 and detect real-time temperature of the hot air curtain. The hot air curtain device 4 is configured to control temperature and wind speed of the hot air curtain.

As shown in FIG. 2, the control device 5 includes a first temperature sensor set 51, a second temperature sensor set 52, a wind speed sensor set 53, an angle sensor 54, and a controller 55.

The first temperature sensor set 51 is arranged in the baking chamber 11, and is configured to detect the real-time temperature of the baking chamber 11. The second temperature sensor set 52 is arranged at the side door 2 and is configured to detect the real-time temperature of the hot air curtain. If a double-layer air curtain is arranged, temperature detection is performed by utilizing the first temperature sensor set 51. The first temperature sensor set 51 and the second temperature sensor set 52 are connected with the controller 55 for transmitting signals. The first temperature sensor set 51 and the second temperature sensor set 52 are configured to transmit the detected real-time temperature to the controller 55.

The wind speed sensor set 53 is connected with the controller 55, and is configured to acquire wind speed information of the hot air curtain and transmits the wind speed information to the controller 55.

The angle sensor 54 is arranged on the side door 2 and is connected with the controller 55. The angle sensor 54 is configured to acquire open information of the side door 2. When the controller 55 receives the open information of the side door 2 from the angle sensor 54, the controller 55 controls the hot air curtain system 4 that starts operating.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. A substrate pre-baking device, comprising:
    a baking box housing having a baking chamber in an interior space of the baking box housing, wherein an opening corresponding to a side door is arranged on a lateral side of the baking box housing;
    the side door arranged at the opening of the baking box housing;
    a heating structure arranged in the baking chamber; and
    a hot air curtain device arranged at the side door of the baking box housing;
    wherein when the side door is opened, the hot air curtain device is configured to form a hot air curtain for isolating the baking chamber from an external environment at the opening of the side door;
    wherein the hot air curtain device comprises:
    a plurality of air outlets arranged on an upper side of the opening corresponding to the side door;
    a plurality of channels in communication with the air outlets;
    a plurality of heating tubes arranged in the channels and connected with a controller; and
    at least one fan arranged in the channels and connected with the controller;
    wherein the air outlets comprise:
    a first row of exhaust outlets arranged on a side of the opening of the side door, that is adjacent to the baking chamber, and configured to form a first hot air curtain; and
    a second row of exhaust outlets arranged on a side of the opening of the side door, that is adjacent to the external environment, and configured to form a second hot air curtain;
    wherein the first row of exhaust outlets and the second row of exhaust outlets are arranged side by side; and
    wherein temperature of the second hot air curtain can be close to that of external environment, and is less than temperature of the first hot air curtain, and temperature of the first hot air curtain is approximately the same as temperature in the baking chamber.

2. The substrate pre-baking device according to claim 1, wherein wind speed of the second hot air curtain is less than wind speed of the first hot air curtain.

3. The substrate pre-baking device according to claim 1, wherein temperature of the second hot air curtain is less than temperature of the first hot air curtain.

4. The substrate pre-baking device according to claim 1, further comprising a control device, wherein the heating structure and the hot air curtain device are connected with the control device for transmitting signals, the control device is configured to detect real-time temperature of the baking chamber, the heating structure is configured to control real-time temperature of the baking chamber and detect real-time temperature of the hot air curtain, and the hot air curtain device is configured to control temperature and wind speed of the hot air curtain.

5. The substrate pre-baking device according to claim 4, wherein the control device comprises:
    a first temperature sensor set arranged in the baking chamber, and configured to detect real-time temperature of the baking chamber;
    a second temperature sensor set arranged at the side door, and configured to detect the real-time temperature of the hot air curtain; and
    a controller connected to the first temperature sensor set and the second temperature sensor set for transmitting signals, wherein the first temperature sensor set and the second temperature sensor set are configured to transmit the detected real-time temperature to the controller.

6. The substrate pre-baking device according to claim 5, wherein the control device further comprises a wind speed sensor set that is connected with the controller, configured to acquire wind speed information of the hot air curtain, and transmits the wind speed information to the controller.

7. The substrate pre-baking device according to claim 5, further comprising an angle sensor arranged on the side door and connected with the controller, wherein the angle sensor is configured to acquire open information of the side door, and when the controller receives the open information of the side door from the angle sensor, the controller controls the hot air curtain system that starts operating.

* * * * *